United States Patent [19]

Nagano

[11] 4,338,527
[45] Jul. 6, 1982

[54] VOLTAGE-CURRENT CONVERSION CIRCUIT

[75] Inventor: Katsumi Nagano, Hiratsuka, Japan

[73] Assignee: Tokyo Shibaura Denki Kabushiki Kaisha, Japan

[21] Appl. No.: 158,520

[22] Filed: Jun. 11, 1980

[30] Foreign Application Priority Data

Jun. 27, 1979 [JP] Japan .................................. 54/81127

[51] Int. Cl.³ .............................................. H03K 5/22
[52] U.S. Cl. ................................ 307/494; 307/296 R; 330/69; 330/257
[58] Field of Search .................. 307/490, 494, 296 R; 330/257, 69

[56] References Cited

U.S. PATENT DOCUMENTS

| | | | |
|---|---|---|---|
| 3,194,985 | 7/1965 | Smith, Jr. et al. | 307/494 |
| 3,309,615 | 3/1967 | Baldwin et al. | 307/494 |
| 4,045,694 | 8/1977 | Ahmed | 307/494 |
| 4,223,276 | 9/1980 | Nagano | 330/257 |

OTHER PUBLICATIONS

Sedra et al., A Second-Generation Current Conveyor and its Applications, IEEE Transactions on Circuit Theory, pp. 132-134, (Feb. 1970).
Black et al., Gyrator Implementation With Integrable Current Conveyors, IEEE Journal of Solid-State Circuits, vol. SC-6, No. 6, pp. 296-399, (Dec. 1971).
Fairchild Linear Integrated Circuits, Technical Data for the μA749 Dual Operational Amplifier.

Primary Examiner—Stanley D. Miller, Jr.
Assistant Examiner—B. P. Davis
Attorney, Agent, or Firm—Finnegan, Henderson, Farabow, Garrett & Dunner

[57] ABSTRACT

A voltage-current conversion circuit comprises an input terminal, a conversion terminal, an output terminal, first and second emitter-coupled transistors having their bases respectively connected to the input terminal receiving an input signal and the conversion terminal, a current mirror load circuit connected to collectors of the first and second transistors, a constant current source connected to emitters of the first and second transistors, and an output transistor having its base connected to the collector of the second transistor and its emitter to the conversion terminal. When the collector of the output transistor is connected to the output terminal and an impedance element is connected to the conversion terminal, a current is provided at the output and conversion terminals which is obtained by dividing an input signal voltage applied to the input terminal with an impedance value of the impedance element. The voltage-current conversion circuit serves as a negative current conveyor. When the collector of the output transistor is connected to an input terminal of a current mirror having its output terminal connected to the output terminal of the conversion circuit, the converting circuit serves as a positive current conveyor. Proper combinations of the positive and/or negative current conveyors provide various analog computation circuits.

10 Claims, 9 Drawing Figures

VOLTAGE-CURRENT CONVERSION CIRCUIT

BACKGROUND OF THE INVENTION

The invention relates to a voltage-current conversion circuit adaptable for constructing a computation circuit for analog quantities.

A circuit using an operational amplifier has been known for an adder circuit for analog quantities. An operational amplifier has a very high voltage gain. To practically use the operational complifier, therefore, a feedback loop is provided for reducing the voltage gain. The adder circuit using an operational amplifier, therefore, can be said to be unnecessarily complicated as an adder circuit because of inclusion of considerably useless circuit portions.

SUMMARY OF THE INVENTION

Accordingly, an object of the invention is to provide a voltage-current conversion circuit simple in construction.

Another object of the invention is to provide an analog computing circuit using the aforesaid voltage-current conversion circuit.

A voltage-current converting circuit according to the invention comprises an input terminal for receiving an input signal; a conversion terminal; an output terminal; first and second emitter-coupled transistors having their bases respectively connected to the input terminal and the conversion terminal; a load circuit, such as a current mirror, connected between the collectors of the first and second transistors and a first power supply terminal; a constant current source connected between the emitters of the first and second transistors and a second power supply terminal; and an output transistor having its base connected to the collector of the second transistor and its emitter to the conversion terminal.

In an embodiment of the invention, the collector of the output transistor is connected to the output terminal. With such an arrangement, when an impedance element such as a resistor is connected between the conversion terminal and circuit ground, there is provided at each of the output terminal and conversion terminal a current which is obtained by dividing an input signal voltage applied to the input terminal with an impedance value of the impedance element. The current flows into the output terminal and out of the conversion terminal. Accordingly, the circuit arrangement of the embodiment serves as a negative current conveyor.

In another embodiment of the invention, the collector of the output transistor is connected to an input of the current mirror having its output connected to the output terminal of the voltage-current conversion circuit. This circuit arrangement provides a positive current conveyor. A proper combination of those current conveyors provides a desired analog computation circuit.

DETAILED DESCRIPTION OF THE PREFERRED EMBODIMENTS

Figure 1:
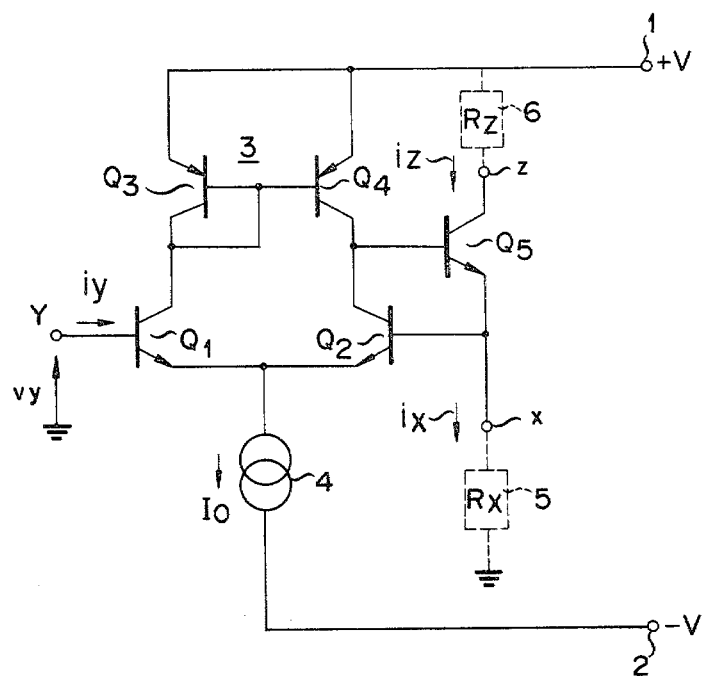
FIG. 1 is a circuit diagram of a voltage-current conversion circuit according to an embodiment of the invention.

In FIG. 1 showing a voltage-current conversion circuit embodying the invention, emitter-coupled differential transistors Q1 and Q2 have their bases respectively coupled with an input terminal y and a conversion terminal x. A current mirror load circuit 3 comprised of transistors Q3 and Q4 is connected between the collectors of differential transistors Q1 and Q2 and a positive power supply terminal 1. A constant current source 4 is connected between the emitters of differential transistors Q1 and Q2 and a negative power supply terminal 2. An output transistor Q5 has its base connected to the collector of transistor Q2, its emitter to the conversion terminal x, and its collector to an output terminal z. An input signal voltage $V_y$ is applied between the input terminal y and circuit ground. A load impedance element 5, e.g. a resistive element, is connected between the conversion terminal x and circuit ground. A load impedance element 6, e.g. a resistive element, is connected between the output terminal z and the positive power supply terminal 1.

The voltage-current conversion circuit of FIG. 1 has following relations:

$$v_x = v_y \tag{1}$$

$$i_z = -i_x \tag{2}$$

$$i_y = 0 \tag{3}$$

where $v_x$ and $v_y$ represent voltages at the conversion terminal x and input terminal y respectively, and $i_x$, $i_y$ and $i_z$ represent currents at the conversion, input and output terminals x, y and z, respectively.

The reasons for the above relations will be described hereinafter. When $v_y > v_x$, the collector current of transistor Q1 is larger than that of transistor Q2. Accordingly, a current equal to the difference between the collector currents of transistors Q1 and Q2 flows into the base of transistor Q5 to increase the emitter current of transistor Q5. The increase of the emitter current of transistor Q5 increases a voltage drop across the impedance element 5, that is, $v_x$.

On the other hand, when $v_y < v_x$, the emitter current of transistor Q5 decreases. Accordingly, the voltage drop across the impedance element 5 is reduced. The change of $v_x$ stops when $v_x$ becomes equal to $V_y$. In the stable state of the circuit of FIG. 1, it will be understood that $v_x = v_y$.

The $i_z$ and $i_x$ are collector and emitter currents of the transistor Q5, respectively, with a relation $i_z = \alpha i_x$ where $\alpha$ is a common base forward current gain and approximates to 1. Accordingly, $i_z = i_x$. In equation (2), the minus sign attached before $i_x$ indicates that $i_z$ flows into the terminal z while $i_x$ flows out of the terminal x.

In a differential amplifier, normally $v_x = v_y$. Under this condition, the collector currents $I_{c1}$ and $I_{c2}$ of transistors Q1 and Q2 are each equal to half of the current $I_o$ of the constant current source 4. The base current $i_y$ of transistor Q1 is given by $$i_y = \frac{I_{c1}}{\beta} = \frac{I_o}{2\beta}$$

where $\beta$ is a common-emitter forward current gain. Since $\beta \gg 1$, $i_y \approx 0$. Similarly, the base current of transistor Q2 is approximately zero.

Figure 2:
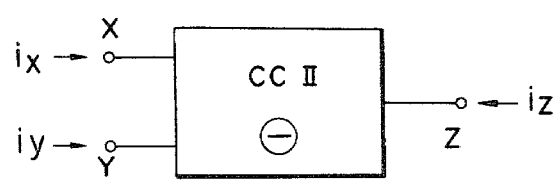
FIG. 2 shows the circuit of FIG. 1 in block form.

In the circuit of FIG. 1, there is derived from the conversion terminal x connected to the impedance element 5 the current $i_x$ $$\left( = \frac{v_y}{R_x} \right)$$

obtained by dividing the input signal voltage $v_y$ applied to the input terminal y by an impedance value $R_x$ of the impedance element 5. Obtained at the output terminal z is a level-shifted output voltage corresponding to the product of the current $i_x$ and an impedance value $R_z$ of the impedance element 6. The circuit shown in FIG. 1 is categorized into a circuit, called a negative second generation current conveyor (briefly, CCII⊖), and is expressed by a block form as shown in FIG. 2. The mathematical expression of the CCII⊖ is $$\begin{pmatrix} i_y \\ v_x \\ i_z \end{pmatrix} = \begin{pmatrix} 0 & 0 & 0 \\ 1 & 0 & 0 \\ 0 & -1 & 0 \end{pmatrix} \begin{pmatrix} v_y \\ i_x \\ v_z \end{pmatrix}$$

Although the circuit of FIG. 1 has an operating condition of $v_z > v_x = v_y \geq 0$ it may be constructed merely by a differential amplifier circuit and an output transistor.

Figure 3:
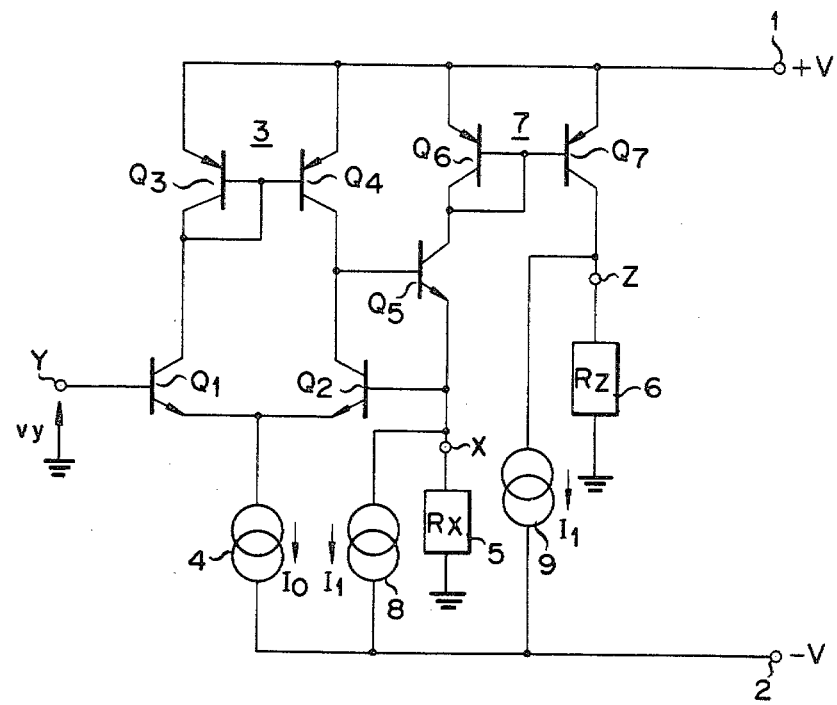
FIG. 3 is a circuit diagram of a voltage-current conversion circuit according to another embodiment of the invention.

FIG. 3 shows a voltage-current conversion circuit constructed as a positive current conveyor. In FIG. 3, like characters and numerals are used to designate like portions in FIG. 1. The circuit is provided with a current mirror circuit 7 including transistors Q6 and Q7. In the current mirror circuit 7, the transistor Q6 has its collector and base connected together and its emitter connected to the positive power source terminal 1. The collector of transistor Q6, that is, an input terminal of the current mirror circuit 7, is connected to the collector of output transistor Q5. The collector of the transistor Q7 whose emitter is connected to the positive power source terminal 1, that is, an output terminal of the current mirror circuit 7, is connected to the output terminal z of the voltage-current conversion circuit. The impedance element 5 is connected between the conversion terminal x and circuit ground. The impedance element 6 is connected between the output terminal z and circuit ground. With this connection, the current $i_x$ equal to $v_y/R_x$ is obtained at the conversion terminal x, and the output voltage $v_z$ equal to $v_y \times (R_z/R_x)$ is taken out of the output terminal z. In the circuit of FIG. 3, when the current at the conversion terminal x flows out of the circuit, the current at the output terminal z flows out of the circuit, and, on the other hand, the current at the conversion terminal x flows into the circuit, the current at the output terminal z flows into the circuit. In other words, the circuit of FIG. 3 has a positive transfer polarity.

As shown in FIG. 3, constant current sources 8 and 9 for feeding a constant current $I_1$ may be connected between the conversion terminal x and the negative power supply terminal 2, and between the output terminal z and the negative power supply terminal 2. With such a circuit arrangement, the input signal applied to the input terminal y is not limited with respect to the polarity thereof. When an input signal of a positive polarity is applied to the input terminal y, currents flow out of the circuit at the conversion terminal x and the output terminal z. When an input signal of a negative polarity is inputted, currents flow into the circuit at the terminals x and z.

Figure 4:
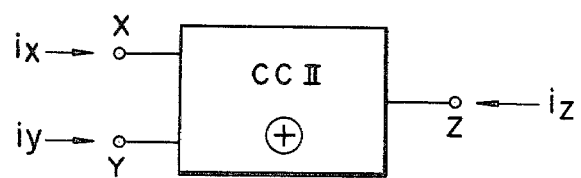
FIG. 4 shows the circuit of FIG. 3 in block form.

The circuit of FIG. 3 may depicted by a block form as shown in FIG. 4 and its mathematical expression is $$\begin{pmatrix} i_y \\ v_x \\ i_z \end{pmatrix} = \begin{pmatrix} 0 & 0 & 0 \\ 1 & 0 & 0 \\ 0 & 1 & 0 \end{pmatrix} \begin{pmatrix} v_y \\ i_x \\ v_z \end{pmatrix}$$

Figure 5:
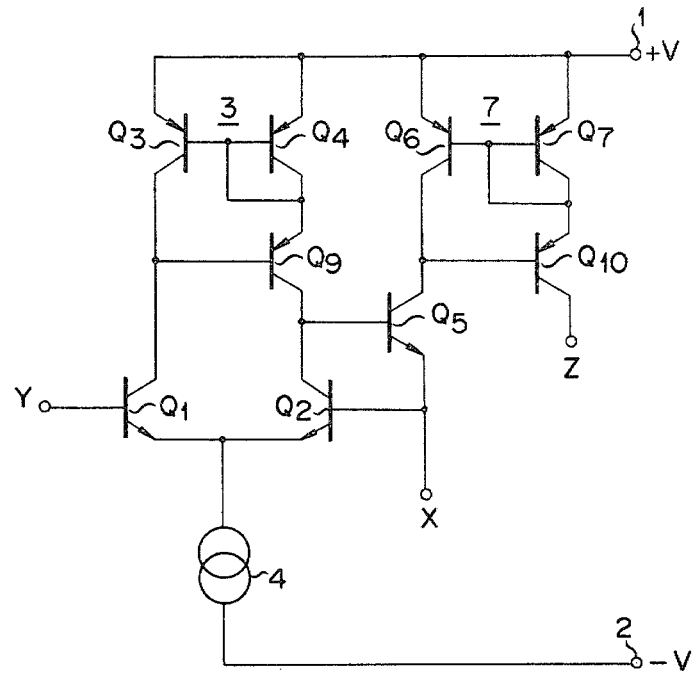
FIG. 5 shows a modification of the circuit of FIG. 3 in which three-transistor current mirrors are used.

FIG. 5 is a modification of the circuit of FIG. 3. The two-transistor current mirror circuit 3 is replaced by a three-transistor current mirror or Wilson source comprised of transistors Q3, Q4 and Q9. The current mirror circuit 7 is also replaced by a three-transistor current mirror or Wilson source comprised of transistors Q6, Q7 and Q10. When the Wilson source is used, the ratio of input current to output current of current mirror becomes closer to 1 than the two-transistor current mirror, so that an offset voltage appearing at the conversion terminal x may be reduced.

Figure 6:
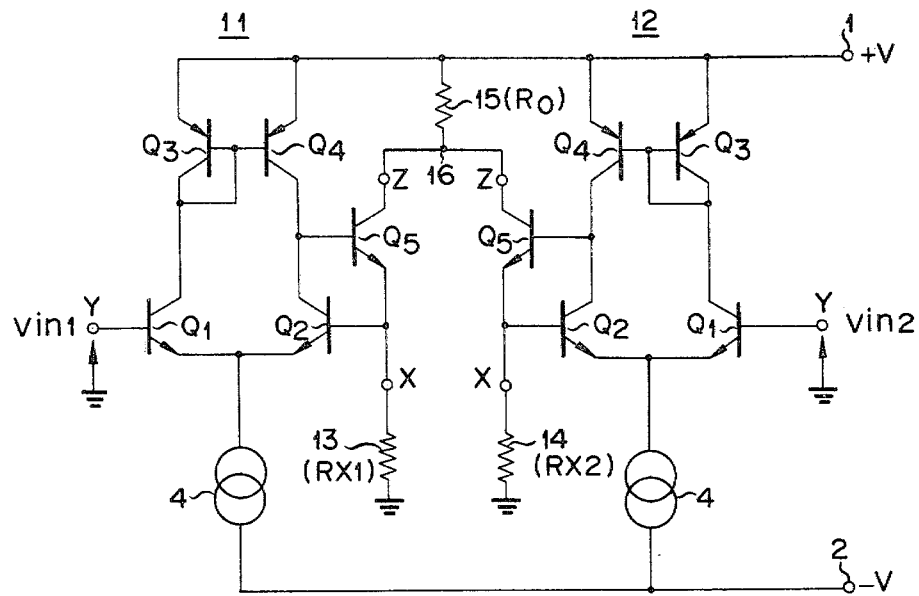
FIG. 6 is a circuit diagram of an adder circuit using the circuit of FIG. 1.

FIG. 6 shows an adder circuit using a couple of the FIG. 1 circuits. As shown, an impedance element 13 (in this example, shown by a resistor having a resistance of $R_{x1}$) is connected between the conversion terminal x of the first circuit 11 and circuit ground. An impedance element 14 (in this example, a resistor having a resistance of $R_{x2}$) is connected between the conversion terminal x of the second circuit 12 and circuit ground. The output terminals z of the first and second circuits 11 and 12 are connected commonly with each other. An impedance element 15 (in this example, a resistor having a resistance of $R_o$) is connected between a connecting point 16 of the output terminals z and the positive power source terminal 1. An input signal $v_{in1}$ is applied to the input terminal y of the first circuit 11, while an input signal $v_{in2}$ is applied to the input terminal y of the second circuit 12.

With such a construction, a current $v_{in1}/R_{x1}$ appears at the output terminal z of the first circuit 11, while a current $v_{in2}/R_{x2}$ appears at the output terminal z of the second circuit 12. Since the sum of those currents flow through the resistor 15, the output voltage $v_o$ developed across the resistor 15 is $$v_o = \left( \frac{v_{in1}}{R_{x1}} + \frac{v_{in2}}{R_{x2}} \right) \cdot R_o$$

$$= \frac{R_o}{R_{x1}} \cdot v_{in1} + \frac{R_o}{R_{x2}} \cdot v_{in2}$$

Figure 7:
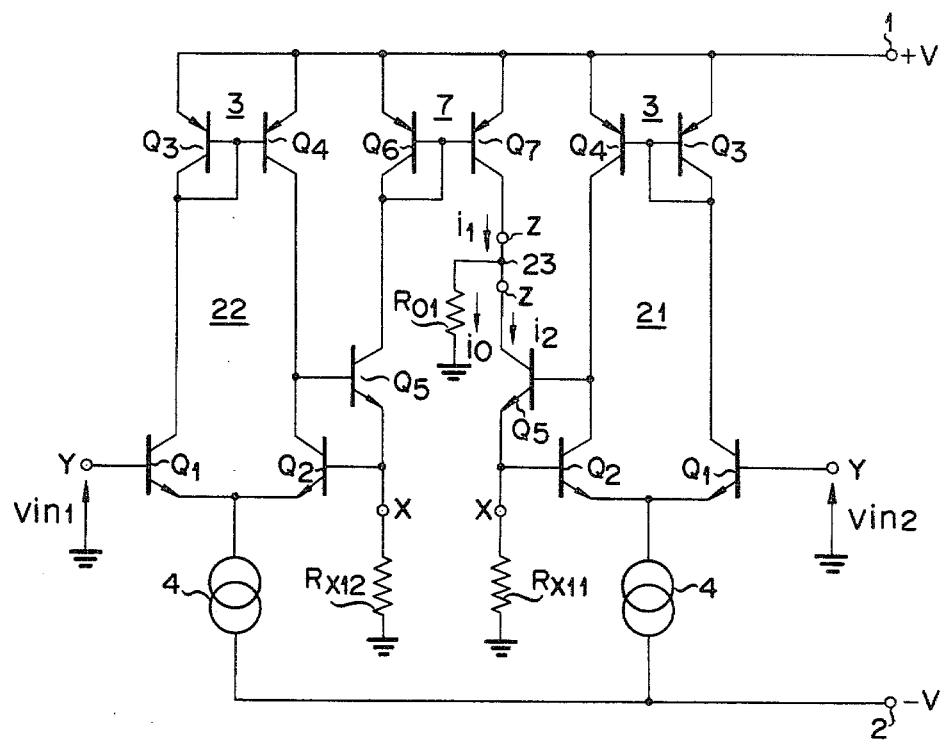
FIG. 7 is a circuit diagram of a subtraction circuit using the circuits of FIGS. 1 and 2.

FIG. 7 shows a subtraction circuit which is composed of a negative current conveyor 21 shown in FIG. 1 and a positive current conveyor 22 shown in FIG. 3. As shown, a resistor $R_{x11}$ is connected between the conversion terminal x of the circuit 21 and circuit ground. A resistor $R_{x12}$ is connected between the conversion terminal x of the circuit 22 and circuit ground. A resistor $R_{o1}$ is connected between a connection point of the output terminals z of the circuits 21 and 22 and circuit ground.

With such a circuit construction, a current $i_1$ ($=v_{in1}/R_{x12}$) is obtained at the output terminal z of the circuit 22. A current $i_2$ ($=v_{in2}/R_{x11}$) is obtained at the output terminal z of the circuit 21. Accordingly, an output current $i_o$ flowing through the resistor $R_{o1}$, and an output voltage $v_o$ produced across the resistor $R_{o1}$ by the current $i_o$ are given by $$i_o = i_1 - i_2$$

$$= \frac{v_{in1}}{R_{x12}} - \frac{v_{in2}}{R_{x11}}$$

$$v_o = \left( \frac{v_{in1}}{R_{x12}} - \frac{v_{in2}}{R_{x11}} \right) \cdot R_{o1}$$

Figure 8:
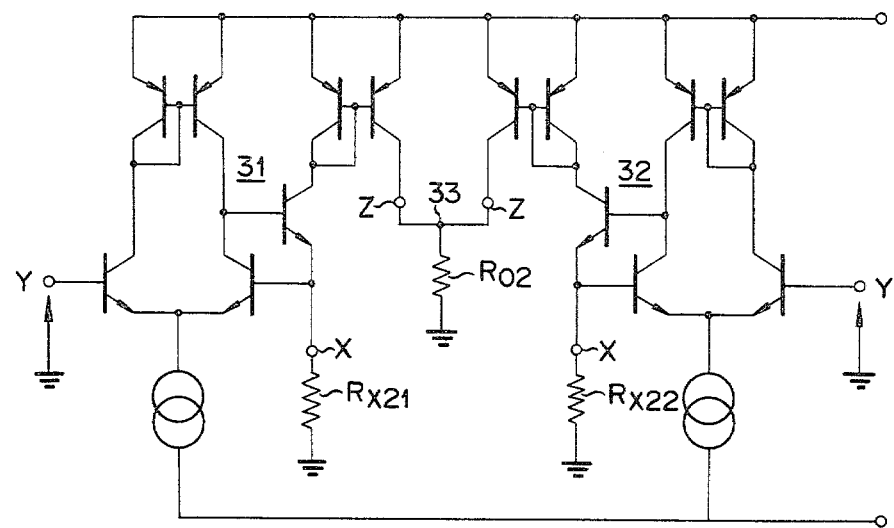
FIG. 8 is a circuit diagram of an adder circuit using the circuit of FIG. 3.

FIG. 8 is an adder circuit composed of a couple of the circuits each shown in FIG. 5. In the circuit, the output terminals z of first and second circuits 31 and 32 are commonly connected. A resistor $R_{o2}$ is connected between the connection point 33 of the output terminals z and circuit ground. A resistor $R_{X21}$ is connected between the conversion terminal x of the first circuit 31 and circuit ground, and a resistor $R_{X22}$ is connected between the conversion terminal x of the second circuit 32 and circuit ground.

Figure 9:
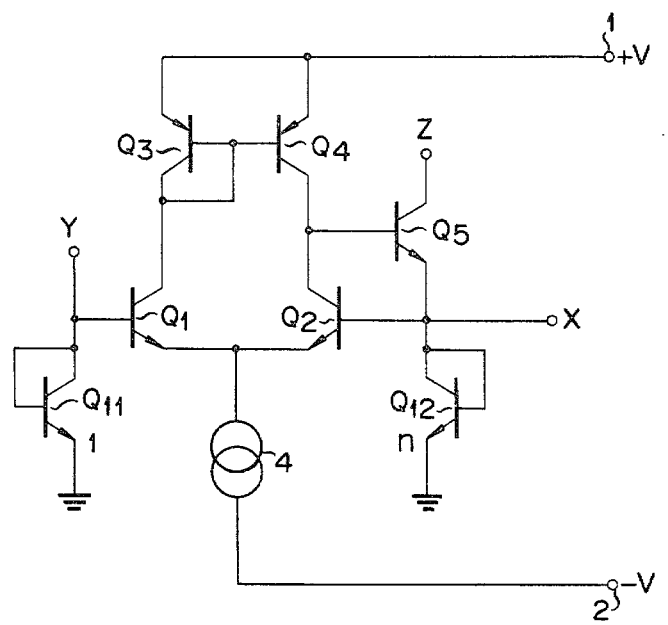
FIG. 9 shows a modification of the circuit of FIG. 1 which is arranged as a current-controlled current source.

The circuit of FIG. 1 may be constructed as a current-controlled current source as shown in FIG. 9. In the circuit, when an input current $i_y$ is fed to the input terminal y, a current n times $i_y$ may be obtained at the output terminal z. To this end, diode-connected transistors Q11 and Q12 with an emitter area ratio of 1:n are connected between the input terminal y and circuit ground, and between the conversion terminal x and the circuit ground, respectively.

The diode characteristic is given below $$v_{BE} = v_T \ln(I_c/I_s)$$

where $v_{BE}$ is a base-to-emitter voltage of a diode-connected transistor, $v_T$ is an electronvolt equivalent of the temperature, $I_c$ a collector current and $I_s$ a reverse saturation current. The reverse saturation current is proportional to an emitter area.

Accordingly, the base-to-emitter voltages $v_{BE11}$ and $v_{BE12}$ of the transistors Q11 and Q12 are $$v_{BE11} = v_T \ln \frac{i_y}{I_s}$$

$$v_{BE12} = v_T \ln \frac{i_z}{nI_s}$$

Since $v_{BE11} = v_{BE12}$, $i_z = n \cdot i_y$. The transistors Q11 and Q12 may also be connected to the input terminal y and the conversion terminal x in FIG. 3.

The present invention is not limited to the above-mentioned embodiments, but may be modified and changed variously. For example, the differential transistors Q1 and Q2, and the output transistor Q5 may be substituted by Darlington-connected transistors. The constant current source 4 of the differential amplifier may be a current source using a high resistance. The load circuit of differential transistors Q1 and Q2 may be constructed by any other suitable circuit than current mirror circuits.

What is claimed is:

1. A voltage-current conversion circuit with an input terminal, a conversion terminal and an output terminal comprising:
    first and second emitter-coupled transistors having their bases connected to said input terminal and said conversion terminal, respectively;
    a load circuit connected between collectors of said first and second transistors and a first power supply terminal;
    a constant current source connected between the emitters of said first and second transistors and a second power supply terminal;
    a third transistor having its base connected to the collector of said second transistor, its emitter to said conversion terminal; and
    a current mirror circuit connected to said first power supply terminal, the collector of said third transistor, and said output terminal.

2. A voltage-current conversion circuit according to claim 1 wherein said load circuit is a current mirror circuit.

3. A voltage-current conversion circuit according to claim 1, further comprising a first impedance element connected between said conversion terminal and circuit ground; and a second impedance element connected between said output terminal and circuit ground.

4. A voltage-current conversion circuit according to claim 3 wherein said first and second impedance elements are resistive elements.

5. A voltage-current conversion circuit according to claim 3, further comprising a second constant current source connected between said conversion terminal and a second power supply terminal; and a third constant current source connected between said output terminal and said second power supply terminal.

6. A voltage-current conversion circuit according to claim 10, wherein said first and second diode-connected transistors have an emitter area ratio of 1:n.

7. An adder circuit comprising:
    first and second circuit means each including an input terminal for receiving an input signal, a conversion terminal and an output terminal, first and second emitter-coupled transistors having their base respectively connected to said input terminal and said conversion terminal, a load circuit connected between collectors of first and second transistors and a first power supply terminal, a constant current source connected between the emitters of said first and second transistors and a second power supply terminal, and a third transistor having its base connected to the collector of said second transistor, its emitter to said conversion terminal and its collector to said output terminal;
    means for connecting said output terminals of said first and second circuit means together;
    a first impedance means connected between the connection point between said output terminals of said first and second circuit means and said first power supply terminal;

a second impedance element connected between said conversion terminal of said first circuit means and circuit ground; and a third impedance element connected between said conversion terminal of said second circuit means and circuit ground.

8. A subtracter circuit comprising:

first and second circuit means each including an input terminal for receiving an input signal, a conversion terminal and an output terminal;

said first circuit means including first and second emitter-coupled transistors having their bases connected to said input terminal and said conversion terminal of said first circuit means, respectively, a first load circuit connected between collectors of said first and second transistors and a first power supply terminal, a first constant current source connected between the emitters of said first and second transistors and a second power supply terminal, a third transistor having its base connected to said collector of said second transistor, its emitter to said conversion terminal of said first circuit means, and its collector to said output terminal of said first circuit means; said second circuit means including fourth and fifth emitter-coupled transistors having their bases connected to said input terminal and said converting terminal of said second circuit means, respectively, a second load circuit connected between collectors of said fourth and fifth transistors and said first power supply terminal, a second constant current source connected between the emitters of said fourth and fifth transistors and said second power supply terminal, a sixth transistor having its base connected to said collector of said fifth transistor, its emitter to said conversion terminal of said second circuit means, and a current mirror connected to collector of said sixth transistor, said first power source terminal and said output terminal of said second circuit means;

means for connecting said output terminals of said first and second circuit means together;

a first impedance element connected between the connection point of said output terminals of said first and second circuit means and circuit ground;

a second impedance element connected between said conversion terminal of said first circuit means and circuit ground; and a third impedance means connected between said conversion terminal of said second circuit means and circuit ground.

9. An adder circuit comprising:

first and second circuit means each including an input terminal for receiving an input signal, a conversion terminal and an output terminal, first and second emitter-coupled transistors having their bases connected to said input terminal and said conversion terminal, respectively, a load circuit connected between collectors of said first and second transistors and said first power supply terminal, a constant current source connected between said emitters of said first and second transistors and a second power supply terminal, a third transistor having its base connected to said collector of said second transistor, and its emitter to said conversion terminal, and a current mirror connected to said first power supply terminal, collector of said third transistor and said output terminal;

means for connecting said output terminals of said first and second circuit means together;

a first impedance element connected between the connection point between said output terminals of said first and second circuit means and circuit ground;

a second impedance element between said conversion terminal of said first circuit means and circuit ground; and a third impedance element connected between said conversion terminal of said second circuit means and circuit ground.

10. A voltage-current conversion circuit with an input terminal, a conversion terminal and an output terminal comprising:

first and second emitter-coupled transistors having their bases connected to said input terminal and said conversion terminal, respectively;

a load circuit connected between a first power supply terminal and the collectors of said first and second transistors;

a constant current source having two terminals, one of said two terminals being connected to the emitters of said first and second transistors and the other of said terminals being connected to a second power supply terminal;

a third transistor having its base connected to said collector of said second transistor, its emitter connected to said conversion terminal, and its collector connected to said output terminal;

a first diode-connected transistor connected between said input terminal and circuit ground; and a second diode-connected transistor connected between said conversion terminal and circuit ground.

* * * * *